(12) United States Patent
Choi

(10) Patent No.: US 7,768,114 B2
(45) Date of Patent: Aug. 3, 2010

(54) SEMICONDUCTOR PACKAGE, STACKED SEMICONDUCTOR PACKAGE HAVING THE SAME, AND A METHOD FOR SELECTING ONE SEMICONDUCTOR CHIP IN A STACKED SEMICONDUCTOR PACKAGE

(75) Inventor: Bok Kyu Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 3 days.

(21) Appl. No.: 12/207,549

(22) Filed: Sep. 10, 2008

(65) Prior Publication Data

US 2009/0321910 A1    Dec. 31, 2009

(30) Foreign Application Priority Data

Jun. 30, 2008    (KR) .................. 10-2008-0062912

(51) Int. Cl.
*H01L 23/02* (2006.01)
(52) U.S. Cl. .................. 257/686; 257/306; 257/311; 257/330; 257/691
(58) Field of Classification Search .................. None
See application file for complete search history.

(56) References Cited

U.S. PATENT DOCUMENTS

| 6,624,506 B2 | 9/2003 | Sasaki et al. |
| 6,649,428 B2 | 11/2003 | Kai |
| 7,212,422 B2 | 5/2007 | Koide |
| 2003/0040131 A1* | 2/2003 | Kai .................. 438/14 |
| 2005/0001306 A1 | 1/2005 | Matsuo et al. |

FOREIGN PATENT DOCUMENTS

| JP | 2006-165073 A | 6/2006 |
| KR | 2001-0066902 A | 7/2001 |
| KR | 2002-0066095 A | 8/2002 |
| KR | 2008-0031094 A | 4/2008 |

* cited by examiner

*Primary Examiner*—N Drew Richards
*Assistant Examiner*—Kyoung Lee
(74) *Attorney, Agent, or Firm*—Ladas & Parry LLP

(57) ABSTRACT

A semiconductor package includes a semiconductor chip having a circuit section. A first chip selection electrode passes through a first position of the semiconductor chip, and the first chip selection electrode has a first resistance and outputs a first signal. A second chip selection electrode passes through a second position of the semiconductor chip, and the second chip selection electrode has a second resistance greater than the first resistance and outputs a second signal. A signal comparison part is formed in the semiconductor chip and is electrically connected to the first and second chip selection electrodes. The signal comparison part compares the first signal applied from the first chip selection electrode to the second signal applied from the second chip selection electrode and outputs a chip selection signal to the circuit section depending upon the result of the comparison.

25 Claims, 4 Drawing Sheets

SEMICONDUCTOR PACKAGE, STACKED SEMICONDUCTOR PACKAGE HAVING THE SAME, AND A METHOD FOR SELECTING ONE SEMICONDUCTOR CHIP IN A STACKED SEMICONDUCTOR PACKAGE

CROSS-REFERENCE TO RELATED APPLICATIONS

The present application claims priority to Korean patent application number 10-2008-0062912 filed on Jun. 30, 2008, which is incorporated herein by reference in its entirety.

BACKGROUND OF THE INVENTION

The present invention relates to a semiconductor package, a stacked semiconductor package having the same, and a method for selecting one semiconductor chip in the stacked semiconductor package.

In semiconductor chip technology, an important factor is the storage and processing capabilities of the semiconductor device. This factor has led to numerous attempts at semiconductor technology possessing the ability to store and process large amounts of data.

Recent developments in semiconductor chip technology include stacked semiconductor packages designed to increase data storage capacity and data processing speed. In a stacked semiconductor package at least two semiconductor packages are stacked.

Stacked semiconductor packages require a package selection technique in which a semiconductor package among the plurality of semiconductor packages is selected to be driven.

Several different methods have been utilized in the industry in order to facilitate selection of one semiconductor package in a stacked semiconductor package, including: the semiconductor chips included in respective semiconductor packages are formed to have different structures; re-distribution lines are formed differently in uniform semiconductor chips; or the semiconductor chips are placed in the shape of steps and conductive wires are connected to the chips to create different arrangements.

However, in the case of manufacturing stacked semiconductor packages using these package selection methods, problems are caused in the manufacture of stacked semiconductor packages using these package selection methods, since when using the above mentioned techniques, the number of manufacturing processes markedly increases.

SUMMARY OF THE INVENTION

Embodiments of the present invention are include a semiconductor package having a structure suitable for a stacked semiconductor package.

Additionally, embodiments of the present invention include a stacked semiconductor package which can select any one semiconductor package among uniform semiconductor packages using the voltage drop effect.

Further, embodiments of the present invention are directed to a method for selecting one semiconductor package in a stacked semiconductor package displaying such selection capabilities.

In one aspect of the present invention, a semiconductor package comprises a semiconductor chip having a circuit section; a first chip selection electrode passing through a first position on the semiconductor chip and having a first resistance; a second chip selection electrode passing through a second position on the semiconductor chip and having a second resistance greater than the first resistance; and a signal comparison part formed in the semiconductor chip and electrically connected to the first and second chip selection electrodes to compare the first signal applied from the first chip selection electrode and the second signal applied from the second chip selection electrode and subsequently output a chip selection signal to the circuit section.

The semiconductor package further comprises a grounded re-distribution line formed on the semiconductor chip, electrically connected to the second chip selection electrode.

The semiconductor package further comprises data electrodes passing through the semiconductor chip and having a third resistance less than the second resistance.

The first resistance and the third resistance are substantially equivalent.

The chip selection signal is outputted from the signal comparison part to the circuit section when the first and second signals are equivalent.

In another aspect of the present invention, a stacked semiconductor package comprises a plurality of semiconductor chips stacked upon one another and having respective circuit sections; first chip selection electrodes passing through first positions on the respective semiconductor chips and having first resistances; second chip selection electrodes passing through second positions on the respective semiconductor chips and having second resistances greater than the first resistances; and signal comparison parts formed in the respective semiconductor chips and electrically connected to the first and second chip selection electrodes of the respective semiconductor chips to output chip selection signals to the circuit sections depending upon the difference between the first and second signals applied from the first and second chip selection electrodes.

The stacked semiconductor package further comprises a substrate on which the semiconductor chips are mounted. This substrate has a signal supply unit for generating the second signals having difference levels and the first signals having the same level as any one of the second signals.

The signal supply unit comprises a voltage divider for dividing a voltage having a preset level into a plurality of voltages having different levels; a power supplying section for supplying the voltage having the preset level to the voltage divider; switching sections for outputting the plurality of voltages divided by the voltage divider; and a driving signal generation section for driving the switching sections.

The voltage divider includes resistors which are connected in series and have a number of nodes corresponding to the number of the semiconductor chips.

The respective resistors have the same resistance value.

The voltage divider further includes an additional grounded resistor connected in series with the resistors, and the second chip selection electrodes have a grounded re-distribution line which is electrically connected to the second chip selection electrodes.

The respective switching sections are connected in parallel to the respective nodes and the respective first chip selection electrodes.

The power supply section supplies the power to the voltage divider and the second chip selection electrodes.

The respective second chip selection electrodes have the same resistance value.

In another aspect of the present invention, a semiconductor package comprises a semiconductor chip having a circuit section; a chip selection electrode passing through the semiconductor chip; a reference voltage supply part formed in the semiconductor chip for outputting a reference voltage; and a signal comparison part formed in the semiconductor chip and electrically connected to the chip selection electrode and the reference voltage supply part to compare the first signal applied from the chip selection electrode and the second signal applied from the reference voltage supply part and to output a chip selection signal to the circuit section.

The semiconductor package further comprises a grounded re-distribution line as a resistor, formed on the semiconductor chip and electrically connected to the chip selection electrode.

The semiconductor package further comprises data electrodes passing through the semiconductor chip having a first resistance. The chip selection electrode has a second resistance greater than the first resistance.

The chip selection signal is outputted from the signal comparison part to the circuit section when the first and second signals are substantially equivalent.

In still another aspect of the present invention, a stacked semiconductor package comprises a plurality of semiconductor chips stacked upon one another and having respective circuit sections; chip selection electrodes passing through the respective semiconductor chips; reference voltage supply parts formed in the respective semiconductor chips, for outputting reference voltages; and signal comparison parts electrically connected to the chip selection electrodes and the reference voltage supply parts of the respective semiconductor chips to output chip selection signals to the circuit sections depending upon the difference in level between the first signals applied from the chip selection electrodes and the second signals applied from the reference voltage supply parts.

The stacked semiconductor package further comprises a substrate on which the semiconductor chips are mounted, the substrate having a signal supply unit for generating the plurality of second signals including the first signals.

The signal supply unit comprises a voltage divider for dividing a voltage having a preset level into a plurality of voltages having different levels; a power supplying section for supplying the voltage having the preset level to the voltage divider; switching sections for outputting the plurality of voltages divided by the voltage divider; and a driving signal generation section for generating driving signals for driving the respective switching sections.

The voltage divider includes resistors which are connected in series and have nodes having a number corresponding to the number of the semiconductor chips.

The respective resistors have the same resistance value.

The voltage divider further includes an additional grounded resistor connected in series with the resistors, and the second chip selection electrodes have a grounded re-distribution line electrically connected to the second chip selection electrodes.

The respective switching sections are connected in parallel with the respective nodes and chip selection electrodes.

In a still further aspect of the present invention, a method for selecting one semiconductor chip of a stack semiconductor package comprises the steps of applying first signals to respective signal comparison parts formed in a plurality of semiconductor chips which are stacked upon one another; applying second signals including the first signals and having different levels, to the respective signal comparison parts of the semiconductor chips; comparing the difference in level of the first signals and the second signals applied to the respective signals comparison parts; and outputting a signal at a chip selection enabling level from the signal comparison part, to which first and second signals having a least level difference are applied.

The step of applying the first signals comprises the steps of generating first signals having different levels; and selecting any one of the first signals having different levels.

The step of generating the first signals having different levels comprises the step of dividing a DC voltage having a preset level into a number of voltages corresponding to the number of semiconductor chips.

The step of applying the second signals to the respective signal comparison parts comprises the step of dividing the DC voltage into a number of voltages corresponding to the number of semiconductor chips.

The step of applying the first signals comprises the step of applying first signals generated from the respective semiconductor chips to the respective signal comparison parts.

The step of applying the second signals comprises the steps of dividing a DC voltage having a preset level, thereby generating preliminary second signals having different levels; outputting a selection signal for selecting any one of the varying preliminary second signals; selecting a preliminary second signal in response to the selection signal; and dividing the selected preliminary second signal in conformity with the number of the semiconductor chips, thereby generating second signals including the first signals and having different levels.

DESCRIPTION OF SPECIFIC EMBODIMENTS

Hereafter, a semiconductor package, a stacked semiconductor package having the same, and a method for selecting one semiconductor chip of the stacked semiconductor package according to specific embodiments of the present invention will be described with reference to the accompanying drawings. It is to be noted that the present invention is not limited to the following embodiments, and a person having ordinary knowledge in the art will appreciate that the present invention can be realized in a variety of different ways without departing from the technical concept of the present invention.

Figure 1:
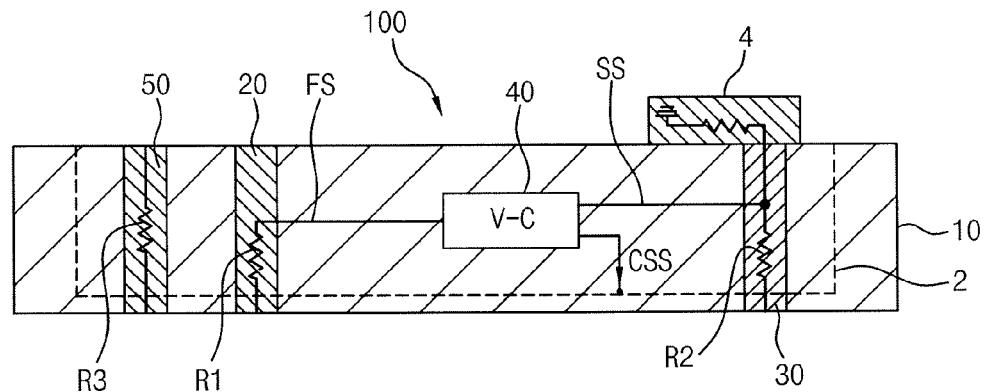
FIG. 1 is a cross-sectional view showing a semiconductor package in accordance with one embodiment of the present invention.

FIG. 1 is a cross-sectional view showing a semiconductor package in accordance with an embodiment of the present invention.

Referring to FIG. 1, the semiconductor package 100 includes a semiconductor chip 10, a first chip selection electrode 20, a second chip selection electrode 30, and a signal comparison part 40.

In one embodiment of the present invention, the semiconductor chip 10 is shaped as a rectangular hexahedron and includes a circuit section 2 and bonding pads (not shown).

The circuit section 2 has, for example, a data storage part (not shown) for storing data and a data processing part (not shown) for processing data.

The bonding pads are electrically connected to the circuit section 2 and can be located on the center portion or adjacent to the edges of the upper surface of the semiconductor chip 10.

The first chip selection electrode 20 passes through the upper surface and the lower surface of the semiconductor chip 10 at a first position of the semiconductor chip 10. In the present embodiment, the first chip selection electrode 20 has an electrical first resistance R1.

The second chip selection electrode 30 passes through the upper surface and the lower surface of the semiconductor chip 10 at a second position of the semiconductor chip 10. In the present embodiment, the second chip selection electrode 30 has an electrical second resistance R2 greater than the first resistance R1.

Meanwhile, a re-distribution line 4 is formed on the upper surface of the semiconductor chip 10 such that the re-distribution line 4 is grounded and electrically connected to the second chip selection electrode 30.

The signal comparison part 40 is formed in the circuit section 2. For example, the signal comparison part 40 compares the two signals received from the first and second chip selection electrodes 20 and 30 and outputs a chip selection signal CSS to the circuit section 2 when the inputted signals have substantially equivalent levels or the difference between the levels of the inputted signals is within a preset range. In the present embodiment, the signal comparison part 40 may comprise a differential amplifier.

For example, a first signal FS is output from the first chip selection electrode 20, and a second signal SS is output from the second chip selection electrode 30. The first and second signals FS and SS are then inputted to the signal comparison part 40. The signal comparison part 40 compares the voltage levels of the received first signal FS and second signal SS and outputs the chip selection signal CSS to the circuit section 2 when the first and second signals FS and SS have substantially equivalent levels or the difference between the levels of the first and second signals FS and SS is within the preset range.

In addition to the first and second chip selection electrodes 20 and 30, the semiconductor chip 10 includes data electrodes 50 through which data is inputted and outputted. The respective data electrodes 50 pass through the upper and lower surfaces of the semiconductor chip 10 and are electrically connected to the circuit section 2 by way of the bonding pads. In the present embodiment, the respective data electrodes 50 have an electrical third resistance R3. In one embodiment of the present invention, the third resistance R3 of the data electrodes 50 is substantially equivalent to the first resistance R1 of the first chip selection electrode 20.

As the chip selection signal CSS is outputted from the signal comparison part 40 to the circuit section 2, data is inputted or outputted to or from the circuit section 2 through the data electrodes 50.

Figure 2:
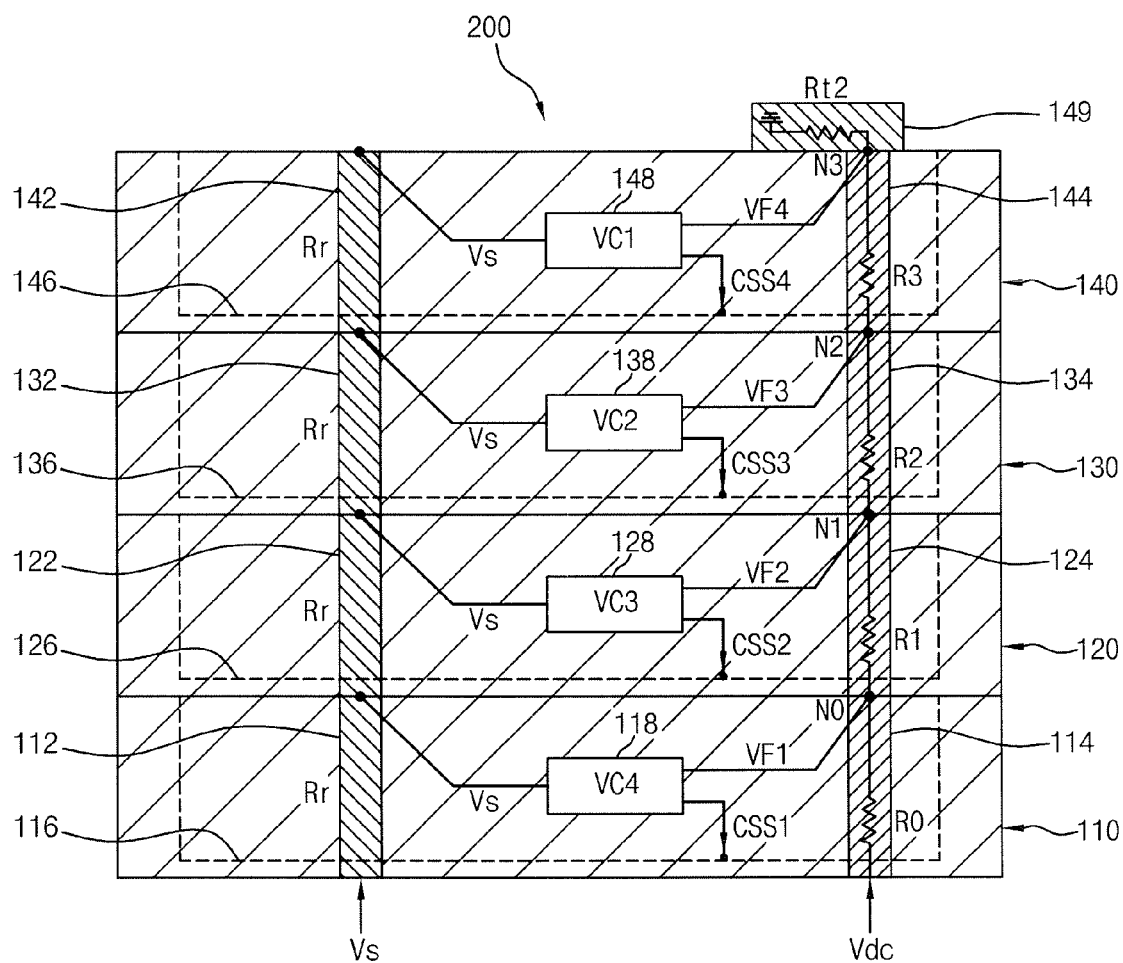
FIG. 2 is a cross-sectional view showing a stacked semiconductor package in which a plurality of the semiconductor packages shown in FIG. 1 are stacked upon one another.

FIG. 2 is a cross-sectional view showing a stacked semiconductor package in which a plurality of the semiconductor packages shown in FIG. 1 are stacked upon one another.

In the embodiment shown in FIG. 2, the stacked semiconductor package 200 has a structure in which two chip selection electrodes are used to select one of the plurality of stacked semiconductor chips.

Referring to FIG. 2, the stacked semiconductor package 200 includes a plurality of stacked semiconductor chips 110, 120, 130, and 140; a plurality of first chip selection electrodes 112, 122, 132, and 142; a plurality of second chip selection electrodes 114, 124, 134, and 144; and signal comparison parts 118, 128, 138, and 148.

In the embodiment of the present invention shown in FIG. 2, the stacked semiconductor package 200 has four stacked semiconductor chips 110, 120, 130 and 140. However, the present invention is not limited to a stack of four semiconductor chips and may include any number of semiconductor chips.

Herebelow, the four semiconductor chips 110, 120, 130 and 140 are referenced as a first semiconductor chip 110, a second semiconductor chip 120, a third semiconductor chip 130, and a fourth semiconductor chip 140.

The second semiconductor chip 120 is placed on the first semiconductor chip 110, the third semiconductor chip 130 is placed on the second semiconductor chip 120, and the fourth semiconductor chip 140 is placed on the third semiconductor chip 130.

The first semiconductor chip 110 includes a first chip selection electrode 112, a second chip selection electrode 114, and a signal comparison part 118 which is formed in the circuit section 116 of the first semiconductor chip 110.

In the present embodiment, the first chip selection electrode 112 is located at a first position of the first semiconductor chip 110, and the second chip selection electrode 114 is located at a second position of the first semiconductor chip 110. The first and second chip selection electrodes 112, 114 each pass through the upper surface and the lower surface (which is opposite the upper surface) of the first semiconductor chip 110. The first chip selection electrode 112 has a first resistance Rr, and the second chip selection electrode 114 has a second resistance R0 greater than the first resistance Rr.

The signal comparison part 118, which is formed in the circuit section 116 of the first semiconductor chip 110, is electrically connected to the first chip selection electrode 112 and the second chip selection electrode 114. The signal comparison part 118 outputs a chip selection signal CSS1 to the circuit section 116 of the first semiconductor chip 110 depending upon the difference in voltage level between the signals received from the first and second chip selection electrodes 112 and 114.

For example, a first signal Vs is applied to the first chip selection electrode 112. Then, the first signal Vs is applied to the signal comparison part 118.

In the event that a DC voltage Vdc is applied to the second chip selection electrode 114, the DC voltage Vdc drops due to the second resistance R0 of the second chip selection electrode 114, and a voltage-dropped second signal VF1 is applied to the signal comparison part 118.

The signal comparison part 118 of the first semiconductor chip 110 compares the voltage level of the first signal Vs to the voltage level of the second signal VF1, and outputs the chip selection signal CSS1 to the circuit section 116 when the voltage levels of the first signal Vs and the second signal VF1 are substantially equivalent or the difference between the two is within a preset range. Conversely, when the signal comparison part 118 compares the voltage levels of the first signal Vs and the second signal VF1, if the difference between the voltage levels of the first signal Vs and the second signal VF1 is not within the preset range, the signal comparison part 118 does not output the chip selection signal CSS1 to the circuit section 116.

The second semiconductor chip 120 includes a first chip selection electrode 122, a second chip selection electrode 124, and a signal comparison part 128.

In the present embodiment, the first chip selection electrode 122 of the second semiconductor chip 120 passes through the upper surface and the lower surface (which is opposite the upper surface) of the second semiconductor chip 120 at a first position of the second semiconductor chip 120. As a result, the first chip selection electrode 122 of the second semiconductor chip 120 is electrically connected in series to the first chip selection electrode 112 of the first semiconductor chip 110.

The second chip selection electrode 124 of the second semiconductor chip 120 passes through the upper surface and the lower surface (which is opposite the upper surface) of the second semiconductor chip 120 at a second position of the second semiconductor chip 120. As a result, the second chip selection electrode 124 of the second semiconductor chip 120 is electrically connected in series to the second chip selection electrode 114 of the first semiconductor chip 110.

The first chip selection electrode 122 of the second semiconductor chip 120 has a first resistance Rr, and the second chip selection electrode 124 has a second resistance R1 greater than the first resistance Rr.

The signal comparison part 128, which is formed in the circuit section 126 of the second semiconductor chip 120, is electrically connected to the first chip selection electrode 122 and the second chip selection electrode 124. The signal comparison part 128 outputs a chip selection signal CSS2 to the circuit section 126 of the second semiconductor chip 120 depending upon the difference in the voltage level between the signals received from the first and second chip selection electrodes 122 and 124. For example, a first signal Vs received from the first chip selection electrode 122 is applied to the signal comparison part 128. A second signal VF2 received from the second chip selection electrode 124 of the second semiconductor chip 120 is also applied to the signal comparison part 128 of the second semiconductor chip 120.

The signal comparison part 128 of the second semiconductor chip 120 compares the voltage level of the first signal Vs to the voltage level of the second signal VF2, and outputs the chip selection signal CSS2 to the circuit section 126 when the voltage levels of the first signal Vs and the second signal VF2 are equivalent or the difference between the two is within a preset range. Conversely, when the signal comparison part 128 compares the voltage levels of the first signal Vs and the second signal VF2, if the difference between the voltage levels of the first signal Vs and the second signal VF2 is not within the preset range, the signal comparison part 128 does not output the chip selection signal CSS2 to the circuit section 126.

The third semiconductor chip 130 includes a first chip selection electrode 132, a second chip selection electrode 134, and a signal comparison part 138.

In the present embodiment, the first chip selection electrode 132 of the third semiconductor chip 130 passes through the upper surface and the lower surface (which is opposite the upper surface) of the third semiconductor chip 130 at a first position of the third semiconductor chip 130. As a result, the first chip selection electrode 132 of the third semiconductor chip 130 is electrically connected in series to the first chip selection electrode 122 of the second semiconductor chip 120.

The second chip selection electrode 134 of the third semiconductor chip 130 passes through the upper surface and the lower surface (which is opposite the upper surface) of the third semiconductor chip 130 at a second position of the third semiconductor chip 130. As a result, the second chip selection electrode 134 of the third semiconductor chip 130 is electrically connected in series to the second chip selection electrode 124 of the second semiconductor chip 120.

The first chip selection electrode 132 of the third semiconductor chip 130 has a first resistance Rr, and the second chip selection electrode 134 has a second resistance R2 greater than the first resistance Rr.

The signal comparison part 138, which is formed in the circuit section 136 of the third semiconductor chip 130, is electrically connected to the first chip selection electrode 132 and the second chip selection electrode 134. The signal comparison part 138 outputs a chip selection signal CSS3 to the circuit section 136 of the third semiconductor chip 130 depending upon the difference in the voltage level between the signals received from the first and second chip selection electrodes 132 and 134.

For example, a first signal Vs received from the first chip selection electrode 132 is applied to the signal comparison part 138. A second signal VF3 received from the second chip selection electrode 134 of the third semiconductor chip 130 is also applied to the signal comparison part 138 of the third semiconductor chip 130.

The signal comparison part 138 of the third semiconductor chip 130 compares the voltage level of the first signal Vs to the voltage level of the second signal VF3, and outputs the chip selection signal CSS3 to the circuit section 136 when the voltage levels of the first signal Vs and the second signal VF3 are equivalent or the difference between the two is within a preset range. Conversely, when the signal comparison part 138 compares the voltage levels of the first signal Vs and the second signal VF3, if the difference between the voltage levels of the first signal Vs and the second signal VF3 is not within the preset range, the signal comparison part 138 does not output the chip selection signal CSS3 to the circuit section 136.

The fourth semiconductor chip 140 includes a first chip selection electrode 142, a second chip selection electrode 144, and a signal comparison part 148.

In the present embodiment, the first chip selection electrode 142 of the fourth semiconductor chip 140 passes through the upper surface and the lower surface (which is opposite the upper surface) of the fourth semiconductor chip 140 at a first position of the fourth semiconductor chip 140. As a result, the first chip selection electrode 142 of the fourth semiconductor chip 140 is electrically connected in series to the first chip selection electrode 132 of the third semiconductor chip 130.

The second chip selection electrode 144 of the fourth semiconductor chip 140 passes through the upper surface and the lower surface (which is opposite the upper surface) of the fourth semiconductor chip 140 at a second position of the fourth semiconductor chip 140. As a result, the second chip selection electrode 144 of the fourth semiconductor chip 140 is electrically connected in series to the second chip selection electrode 134 of the third semiconductor chip 130.

The first chip selection electrode 142 of the fourth semiconductor chip 140 has a first resistance Rr, and the second chip selection electrode 144 has a second resistance R3 greater than the first resistance Rr. A re-distribution line 149 having a resistance Rt2 and serving as an additional resistor is electrically connected to the second chip selection electrode 144.

The signal comparison part 148, which is formed in the circuit section 146 of the fourth semiconductor chip 140, is electrically connected to the first chip selection electrode 142 and the second chip selection electrode 144. The signal comparison part 148 outputs a chip selection signal CSS4 to the circuit section 146 of the fourth semiconductor chip 140 depending upon the difference in the voltage level between the signals received from the first and second chip selection electrodes 142 and 144.

For example, a first signal Vs received from the first chip selection electrode 142 is applied to the signal comparison part 148. A second signal VF4 received from the second chip selection electrode 144 of the fourth semiconductor chip 140 is also applied to the signal comparison part 148 of the fourth semiconductor chip 140.

The signal comparison part 148 of the fourth semiconductor chip 140 compares the voltage level of the first signal Vs to the voltage level of the second signal VF4, and outputs the chip selection signal CSS4 to the circuit section 146 when the voltage levels of the first signal Vs and the second signal VF4 are equivalent or the difference between the two is within a preset range. Conversely, when the signal comparison part 148 compares the voltage levels of the first signal Vs and the second signal VF4, if the difference between the voltage levels of the first signal Vs and the second signal VF4 is not within the preset range, the signal comparison part 148 does not output the chip selection signal CSS4 to the circuit section 146.

In one embodiment of the present invention, the respective first signals Vs applied to the corresponding first chip selection electrodes 112, 122, 132 and 142 of the first through fourth semiconductor chips 110, 120, 130 and 140 have the same voltage level as any one of the respective second signals VF1, VF2, VF3 and VF4 applied to the corresponding second chip selection electrodes 114, 124, 134 and 144 of the first through fourth semiconductor chips 110, 120, 130 and 140. Accordingly, by adjusting the level of the first signals Vs to correspond to any one of the levels of the second signals VF1, VF2, VF3 and VF4, any one of the first through fourth semiconductor chips 110, 120, 130 and 140 can be selected.

Meanwhile, in one embodiment of the present invention, the resistances R0, R1, R2, R3 and Rt2 of the second chip selection electrodes 114, 124, 134 and 144 and the re-distribution line 149 of the first through fourth semiconductor chips 110, 120, 130 and 140 have substantially equivalent values.

The nodes, which are formed in the respective second chip selection electrodes 114, 124, 134 and 144 of the first through fourth semiconductor chips 110, 120, 130 and 140, are respectively defined as a node N0, a node N1, a node N2, and a node N3 as shown in FIG. 2.

The second signal VF1 outputted from the node N0 is applied to the signal comparison part 118 of the first semiconductor chip 110; the second signal VF2 outputted from the node N1 is applied to the signal comparison part 128 of the second semiconductor chip 120; the second signal VF3 outputted from the node N2 is applied to the signal comparison part 138 of the third semiconductor chip 130; and the second signal VF4 outputted from the node N3 is applied to the signal comparison part 148 of the fourth semiconductor chip 140.

Figure 3:
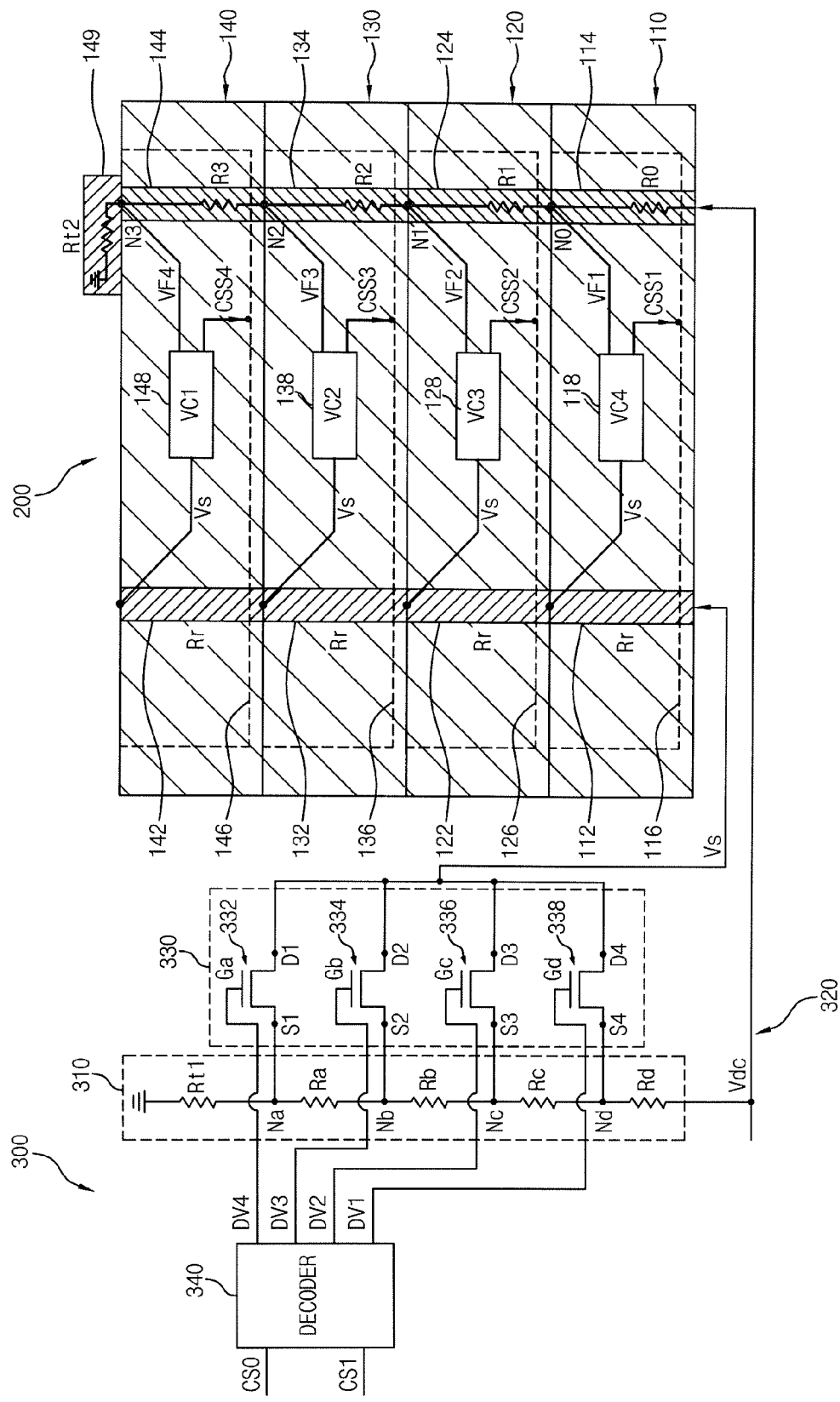
FIG. 3 is a block diagram showing a signal supply unit for generating first signals and second signals having different levels for use in the stacked semiconductor package shown in FIG. 2.

FIG. 3 is a block diagram showing a signal supply unit for generating the first signals and also generating second signals each having a different voltage level.

Referring to FIG. 3, the stacked semiconductor package 200 further includes a signal supply unit 300. The signal supply unit 300 outputs the second signals VF1, VF2, VF3 and VF4 each having a different voltage level to the second chip selection electrodes 114, 124, 134, and 144. The signal supply unit also generates the first signals Vs, such that the voltage level of each of the first signals Vs is the same and is equivalent to one of the second signals VF1, VF2, VF3, and VF4.

In the present embodiment, the signal supply unit 300 can be placed on a substrate such as a printed circuit board, on which the first through fourth semiconductor chips 110, 120, 130 and 140 are mounted.

The signal supply unit 300 includes a voltage divider 310, a power supply section 320, switching sections 330, and a driving signal generation section 340.

The voltage divider 310 divides a DC voltage into voltages having different levels. The voltage divider 310 includes resistors Ra, Rb, Rc and Rd connected in series. In one embodiment of the present invention, the number of the resistors Ra, Rb, Rc and Rd corresponds to the number of the stacked semiconductor chips. For example, since the number of the semiconductor chips is 4 in FIG. 3, the number of the resistors Ra, Rb, Rc and Rd of the voltage divider 310 is set to 4. Meanwhile, an additional grounded resistor Rt1 is connected to the resistor Ra.

The voltage divider 310 having the four resistors Ra, Rb, Rc and Rd, which are connected in series, has four nodes Na, Nb, Nc, and Nd. The node Na is formed between the additional resistor Rt1 and the resistor Ra; the node Nb is formed between the resistors Ra and Rb; the node Nc is formed between the resistors Rb and Rc; and the node Nd is formed between the resistors Rc and Rd.

The power supply section 320 outputs a DC voltage Vdc. The power supply section 320 is connected to the resistor Rd of the voltage divider 310 and the second chip selection electrode 114 of the first semiconductor chip 110, by which the DC voltage Vdc is applied to the resistor Rd and the second chip selection electrode 114.

The number of driving signals generated by the driving signal generation section 340 corresponds to the number of the semiconductor chips. In one embodiment of the present invention, the driving signal generation section 340 generates four driving signals Dv1, Dv2, Dv3 and Dv4 corresponding to the number (four) of the semiconductor chips.

The number of switching sections 330 corresponds to the number of the semiconductor chips. For example, in the embodiment of the present invention shown in FIG. 3 the number of switching sections 330 is four.

Herebelow, the switching sections 330 are referred to as a first switching section 332, a second switching section 334, a third switching section 336, and a fourth switching section 338.

In the first switching section 332, the source electrode S1 of a transistor is electrically connected to the node Na, the drain electrode D1 is electrically connected in series to the first chip selection electrode 112 of the first semiconductor chip 110, and the gate electrode Ga is electrically connected to the driving signal generation section 340. The driving signal Dv4 applied to the gate electrode Ga is received from the driving signal generation section 340.

In the second switching section 334, the source electrode S2 of a transistor is electrically connected to the node Nb, the drain electrode D2 is electrically connected in series to the first chip selection electrode 112 of the first semiconductor chip 110, and the gate electrode Gb is electrically connected to the driving signal generation section 340. The driving signal Dv3 applied to the gate electrode Gb is received from the driving signal generation section 340.

In the third switching section 336, the source electrode S3 of a transistor is electrically connected to the node Nc, the drain electrode D3 is electrically connected in series to the first chip selection electrode 112 of the first semiconductor chip 110, and the gate electrode Gc is electrically connected to the driving signal generation section 340. The driving signal Dv2 applied to the gate electrode Gc is received from the driving signal generation section 340.

In the fourth switching section 338, the source electrode S4 of a transistor is electrically connected to the node Nd, the drain electrode D4 is electrically connected in series to the first chip selection electrode 112 of the first semiconductor chip 110, and the gate electrode Gd is electrically connected to the driving signal generation section 340. The driving signal Dv1 applied to the gate electrode Gd is received from the driving signal generation section 340.

Hereinbelow, a method for selecting respective semiconductor chips included in the stacked semiconductor package according to the present invention will be described with reference to FIG. 3.

First, when assuming that the respective resistors Ra, Rb, Rc, Rd of the voltage divider 310 and the additional resistor Rt1 have resistance values equivalent to the respective second chip selection electrodes 114, 124, 134, 144 of the first through fourth semiconductor chips 110, 120, 130 and 140 and the re-distribution line 149; if, for example, a DC voltage Vdc of 5[V] (5[V]×5/5) is applied to the resistor Rd and the second chip selection electrode 114 via the power supply section 320: 4[V] (5[V]×4/5) is applied to the node Nd of the voltage divider 310; 3[V] (5[V]×3/5) is applied to the node Nc; 2[V] (5[V]×2/5) is applied to the node Nb; and 1[V] (5[V]×1/5) is applied to the node Na.

The DC voltage Vdc of 5[V] is also applied to the second chip selection electrode 114 of the first semiconductor chip 110, and 4[V] (5[V]×4/5) is applied to the node N0. By the node N0, the second signal VF1 having the level of 4[V] is applied to the signal comparison part 118 of the first semiconductor chip 110.

3[V] (5[V]×3/5) is applied to the node N1. By the node N1, the second signal VF2 having the level of 3[V] is applied to the signal comparison part 128 of the second semiconductor chip 120.

2[V] (5[V]×2/5) is applied to the node N2. By the node N2, the second signal VF3 having the level of 2[V] is applied to the signal comparison part 138 of the third semiconductor chip 130.

1[V] (5[V]×1/5) is applied to the node N3. By the node N3, the second signal VF4 having the level of 1[V] is applied to the signal comparison part 148 of the fourth semiconductor chip 140.

When the first semiconductor chip 110 is selected: the second signal VF1 having the level of 4[V] is applied to the signal comparison part 118 of the first semiconductor chip 110, the second signal VF2 having the level of 3[V] is applied to the signal comparison part 128 of the second semiconductor chip 120, the second signal VF3 having the level of 2[V] is applied to the signal comparison part 138 of the third semiconductor chip 130, and the second signal VF4 having the level of 1[V] is applied to the signal comparison part 148 of the fourth semiconductor chip 140; and thereafter, the driving signal Dv1 outputted from the driving signal generation section 340 in order to select the first semiconductor chip 110 turns on the switching section 338. As the switching section 338 is turned on, the first signals Vs become the voltage level 4[V] of the node Nd, and substantially Vs=4[V] is applied to each of the signal comparison parts 118, 128, 138, and 148 of the first through fourth semiconductor chips 110, 120, 130, and 140 via the first chip selection electrodes 112, 122, 132, and 142.

Accordingly, the first signal Vs having the voltage level of substantially 4[V] and the second signal VF1 having the voltage level of substantially 4[V] are applied to the signal comparison part 118 of the first semiconductor chip 110, and the first signal Vs having the voltage level of substantially 4[V] and the second signal VF2 having the voltage level of substantially 3[V] are applied to the signal comparison part 128 of the second semiconductor chip 120.

Further, the first signal Vs having the voltage level of substantially 4[V] and the second signal VF3 having the voltage level of substantially 2[V] are applied to the signal comparison part 138 of the third semiconductor chip 130, and the first signal Vs having the voltage level of substantially 4[V] and the second signal VF4 having the voltage level of substantially 1[V] are applied to the signal comparison part 148 of the fourth semiconductor chip 140.

Thus, the difference in voltage level between the first signal Vs and the second signal VF1 applied to the signal comparison part 118 included in the first semiconductor chip 110 is substantially 0[V], the difference in voltage level between the first signal Vs and the second signal VF2 applied to the signal comparison part 128 included in the second semiconductor chip 120 is substantially 1[V], the difference in voltage level between the first signal Vs and the second signal VF3 applied to the signal comparison part 138 included in the third semiconductor chip 130 is substantially 2[V], and the difference in voltage level between the first signal Vs and the second signal VF4 applied to the signal comparison part 148 included in the fourth semiconductor chip 140 is substantially 3[V].

As a result, the chip selection signal CSS1 is outputted to the circuit section 116 from the signal comparison part 118 included in the first semiconductor chip 110 (which has the least voltage level difference, approximately 0[V]) among the signal comparison parts 118, 128, 138, and 148 included in the first through fourth semiconductor chips 110, 120, 130, and 140 respectively.

Meanwhile, in order to select the second semiconductor chip 120, the driving signal generation section 340 outputs the driving signal Dv2. As a result, the first signals Vs become the voltage level 3[V] of the node Nc, and substantially Vs=3 [V] is applied to each of the signal comparison parts 118, 128, 138 and 148 of the first through fourth semiconductor chips 110, 120, 130 and 140. As a result, the chip selection signal CSS2 is outputted to the circuit section 126 from the signal comparison part 128 to which the second signal VF2 having the level of substantially 3[V] is applied.

Further, in order to select the third semiconductor chip 130, the driving signal generation section 340 outputs the driving signal Dv3. As a result, the first signals Vs become the voltage level 2[V] of the node Nb, and substantially Vs=2[V] is applied to each of the signal comparison parts 118, 128, 138 and 148 of the first through fourth semiconductor chips 110, 120, 130 and 140. As a result, the chip selection signal CSS3 is outputted to the circuit section 136 from the signal comparison part 138 to which the second signal VF3 having the level of substantially 2[V] is applied.

Moreover, in order to select the fourth semiconductor chip 140, the driving signal generation section 340 outputs the driving signal Dv4. As a result, the first signals Vs become the voltage level 1[V] of the node Na, and substantially Vs=1[V] is applied to each of the signal comparison parts 118, 128, 138 and 148 of the first through fourth semiconductor chips 110, 120, 130 and 140. As a result, the chip selection signal CSS4 is outputted to the circuit section 146 from the signal comparison part 148 to which the second signal VF4 having the level of substantially 1[V] is applied.

Figure 4:
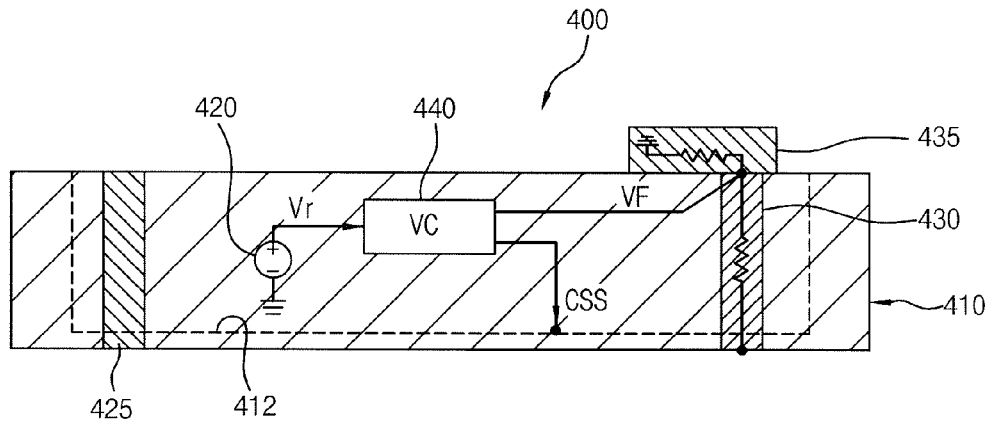
FIG. 4 is a cross-sectional view showing a semiconductor package in accordance with another embodiment of the present invention.

FIG. 4 is a cross-sectional view showing a semiconductor package in accordance with another embodiment of the present invention.

Referring to FIG. 4, a semiconductor package 400 includes a semiconductor chip 410, a reference voltage supply part 420, a chip selection electrode 430, and a signal comparison part 440. In addition, the semiconductor package 400 further includes a data electrode 425 through which data is inputted or outputted. In the present embodiment, the data electrode 425 has an electrical first resistance.

In one embodiment of the present invention, the semiconductor chip 410 has the shape of a rectangular hexahedron and includes a circuit section 412 and bonding pads (not shown).

The circuit section 412 has, for example, a data storage part (not shown) for storing data and a data processing part (not shown) for processing data.

The bonding pads are electrically connected to the circuit section 412 and can be located on the center portion or adjacent to the edges of the upper surface of the semiconductor chip 410.

The reference voltage supply part 420 is formed in the circuit section 412 of the semiconductor chip 410 and outputs a first signal Vr to the signal comparison part 440. The first signal Vr received from the reference voltage supply part 420 may be a voltage signal for driving the semiconductor chip 410.

The chip selection electrode 430 passes through the upper surface and the lower surface (which is opposite the upper surface) of the semiconductor chip 410. In the present embodiment, the chip selection electrode 430 has an electrical second resistance greater than the first resistance of the data electrode 425. A second signal VF is outputted from the chip selection electrode 430.

Meanwhile, a re-distribution line 435 serving as a resistor is formed on the upper surface of the semiconductor chip 410 such that the re-distribution line 435 is grounded and electrically connected to the chip selection electrode 430.

The signal comparison part 440 is formed in the circuit section 412. For example, the signal comparison part 440 compares the first signal Vr to the second signal VF outputted from the reference voltage supply part 420 and the chip selection electrode 430 respectively, and outputs a chip selection signal CSS to the circuit section 412 when the received first and second signals Vr and VF have substantially equivalent voltage levels or the difference between the voltage levels of the first and second signals Vr and VF is within a preset range. In the present embodiment, the signal comparison part 440 may comprise, for example, a differential amplifier.

For example, the first signal Vr is outputted from the reference voltage supply part 420 and the second signal VF is outputted from the chip selection electrode 430. The first and second signals Vr, VF are inputted to the signal comparison part 440. The signal comparison part 440 compares the voltage level of the first signal Vr to the voltage level of the second signal VF and outputs the chip selection signal CSS to the circuit section 412 when the first and second signals Vr and VF have substantially equivalent voltage levels or the difference between the voltage levels of the first and second signals Vr and VF is within the preset range.

As the chip selection signal CSS is outputted from the signal comparison part 440 to the circuit section 412, data is inputted or outputted to or from the circuit section 412 through the data electrode 425.

Figure 5:
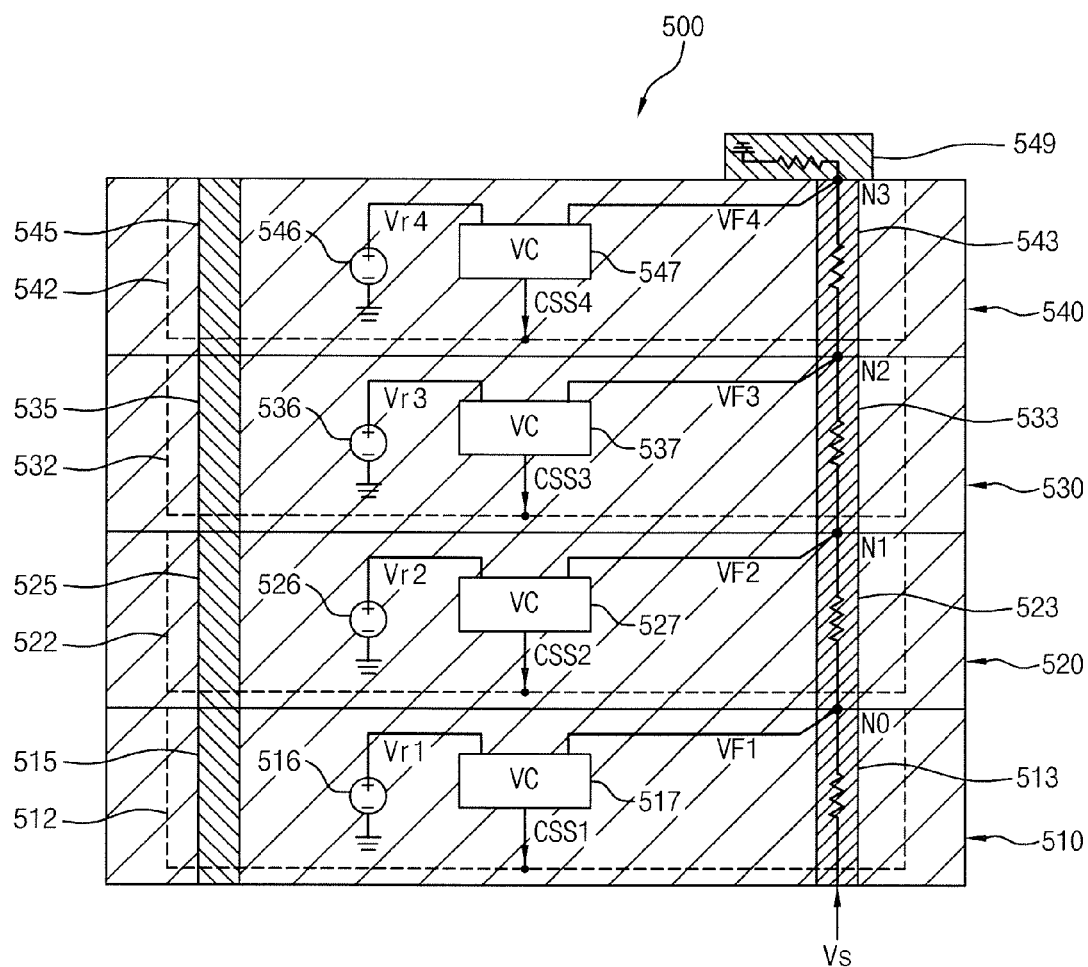
FIG. 5 is a cross-sectional view showing a stacked semiconductor package in which a plurality of the semiconductor packages shown in FIG. 4 are stacked upon one another.

FIG. 5 is a cross-sectional view showing a stacked semiconductor package in which a plurality of the semiconductor packages shown in FIG. 4 are stacked upon one another.

A stacked semiconductor package according to the present embodiment has a structure in which one chip selection electrode facilitates selection of the respective semiconductor chips.

Referring to FIG. 5, a stacked semiconductor package 500 includes a plurality of stacked semiconductor chips 510, 520, 530, and 540; reference voltage supply parts 516, 526, 536, and 546; chip selection electrodes 513, 523, 533, and 543; and signal comparison parts 517, 527, 537, and 547.

In the embodiment of the present invention shown in FIG. 2, the stacked semiconductor package 500 has four stacked semiconductor chips 510, 520, 530 and 540. However, the present invention is not limited to a stack of four semiconductor chips and may include any number of semiconductor chips.

Herebelow, the four semiconductor chips 510, 520, 530, and 540 are referenced as a first semiconductor chip 510, a second semiconductor chip 520, a third semiconductor chip 530, and a fourth semiconductor chip 540. The second semiconductor chip 520 is placed on the first semiconductor chip 510, the third semiconductor chip 530 is placed on the second semiconductor chip 520, and the fourth semiconductor chip 540 is placed on the third semiconductor chip 530.

The first semiconductor chip 510 includes a reference voltage supply part 516, a chip selection electrode 513, and a signal comparison part 517 which is formed in a circuit section 512 of the first semiconductor chip 510.

The signal comparison part 517 is electrically connected to the reference voltage supply part 516 and the chip selection electrode 513. The signal comparison part 517 outputs a chip selection signal CSS1 to the circuit section 512 of the first semiconductor chip 510 depending upon the difference in voltage level between the first signal Vr1 received from the reference voltage supply part 516 and the second signal VF1 received from the chip selection electrode 513.

In detail, the signal comparison part 517 of the first semiconductor chip 510 compares the voltage level of the first signal Vr1 to the voltage level of the second signal VF1 which are received from the reference voltage supply part 516 and the chip selection electrode 513 respectively, and outputs the chip selection signal CSS1 to the circuit section 512 when the voltage levels of the first signal Vr1 and the second signal VF1 are substantially equivalent or the difference between the voltage levels of the first signal Vr1 and the second signal VF1 is within a preset range.

The second semiconductor chip 520 includes a reference voltage supply part 526, a chip selection electrode 523, and a signal comparison part 527 which is formed in a circuit section 522 of the second semiconductor chip 520.

In the present embodiment, the chip selection electrode 523 of the second semiconductor chip 520 is connected in series to the chip selection electrode 513 of the first semiconductor chip 510, and a node N0 is formed between the chip selection electrodes 513 and 523.

The signal comparison part 527, which is formed in the circuit section 522 of the second semiconductor chip 520, is electrically connected to the reference voltage supply part 526 and the chip selection electrode 523. The signal comparison part 527 outputs a chip selection signal CSS2 to the circuit section 522 of the second semiconductor chip 520 depending upon the difference in voltage level between the first signal Vr2 received from the reference voltage supply part 526 and the second signal VF2 received from the chip selection electrode 523.

In detail, the signal comparison part 527 of the second semiconductor chip 520 compares the voltage level of the first signal Vr2 to the voltage level of the second signal VF2 which are received from the reference voltage supply part 526 and the chip selection electrode 523 respectively, and outputs the chip selection signal CSS2 to the circuit section 522 when the voltage levels of the first signal Vr2 and the second signal VF2 are substantially equivalent or the difference between the voltage levels of the first signal Vr2 and the second signal VF2 is within a preset range.

The third semiconductor chip 530 includes a reference voltage supply part 536, a chip selection electrode 533, and a signal comparison part 537 which is formed in a circuit section 532 of the third semiconductor chip 530.

In the present embodiment, the chip selection electrode 533 of the third semiconductor chip 530 is connected in series to the chip selection electrode 523 of the second semiconductor chip 520, and a node N1 is formed between the chip selection electrodes 523 and 533.

The signal comparison part 537, which is formed in the circuit section 532 of the third semiconductor chip 530, is electrically connected to the reference voltage supply part 536 and the chip selection electrode 533. The signal comparison part 537 outputs a chip selection signal CSS3 to the circuit section 532 of the third semiconductor chip 530 depending upon the difference in voltage levels between the first signal Vr3 received from the reference voltage supply part 536 and the second signal VF3 received from the chip selection electrode 533.

In detail, the signal comparison part 537 of the third semiconductor chip 530 compares the voltage level of the first signal Vr3 to the voltage level of the second signal VF3 which are received from the reference voltage supply part 536 and the chip selection electrode 533 respectively, and outputs the chip selection signal CSS3 to the circuit section 532 when the voltage levels of the first signal Vr3 and the second signal VF3 are substantially equivalent or the difference between the voltage levels of the first signal Vr3 and the second signal VF3 is within a preset range.

The fourth semiconductor chip 540 includes a reference voltage supply part 546, a chip selection electrode 543, and a signal comparison part 547 which is formed in the circuit section 542 of the fourth semiconductor chip 540.

In the present embodiment, the chip selection electrode 543 of the fourth semiconductor chip 540 is connected in series to the chip selection electrode 533 of the third semiconductor chip 530, and a node N2 is formed between the chip selection electrodes 533 and 543. A re-distribution line 549 serving as an additional resistor is connected to the chip selection electrode 543 of the fourth semiconductor chip 540, and a node N3 is formed between the re-distribution line 549 and the chip selection electrode 543.

The signal comparison part 547, which is formed in the circuit section 542 of the fourth semiconductor chip 540, is electrically connected to the reference voltage supply part 546 and the chip selection electrode 543. The signal comparison part 547 outputs a chip selection signal CSS4 to the circuit section 542 of the fourth semiconductor chip 540 depending upon the difference in voltage levels between the first signal Vr4 received from the reference voltage supply part 546 and the second signal VF4 received from the chip selection electrode 543.

In detail, the signal comparison part 547 of the fourth semiconductor chip 540 compares the voltage level of the first signal Vr4 to the voltage level of the second signal VF4 which are received from the reference voltage supply part 546 and the chip selection electrode 543 respectively, and outputs the chip selection signal CSS4 to the circuit section 542 when the voltage levels of the first signal Vr4 and the second signal VF4 are substantially equivalent or the difference between the voltage levels of the first signal Vr4 and the second signal VF4 is within a preset range.

In one embodiment of the present invention, the first through fourth signals Vr1, Vr2, Vr3 and Vr4 have substantially equivalent signal levels, and the chip selection electrodes 513, 523, 533, and 543 of the first through fourth semiconductor chips 510, 520, 530, and 540 have substantially equivalent resistance values.

In FIG. 5, the reference numerals 515, 525, 535, and 545 designate data electrodes through which data is inputted or outputted.

Figure 6:
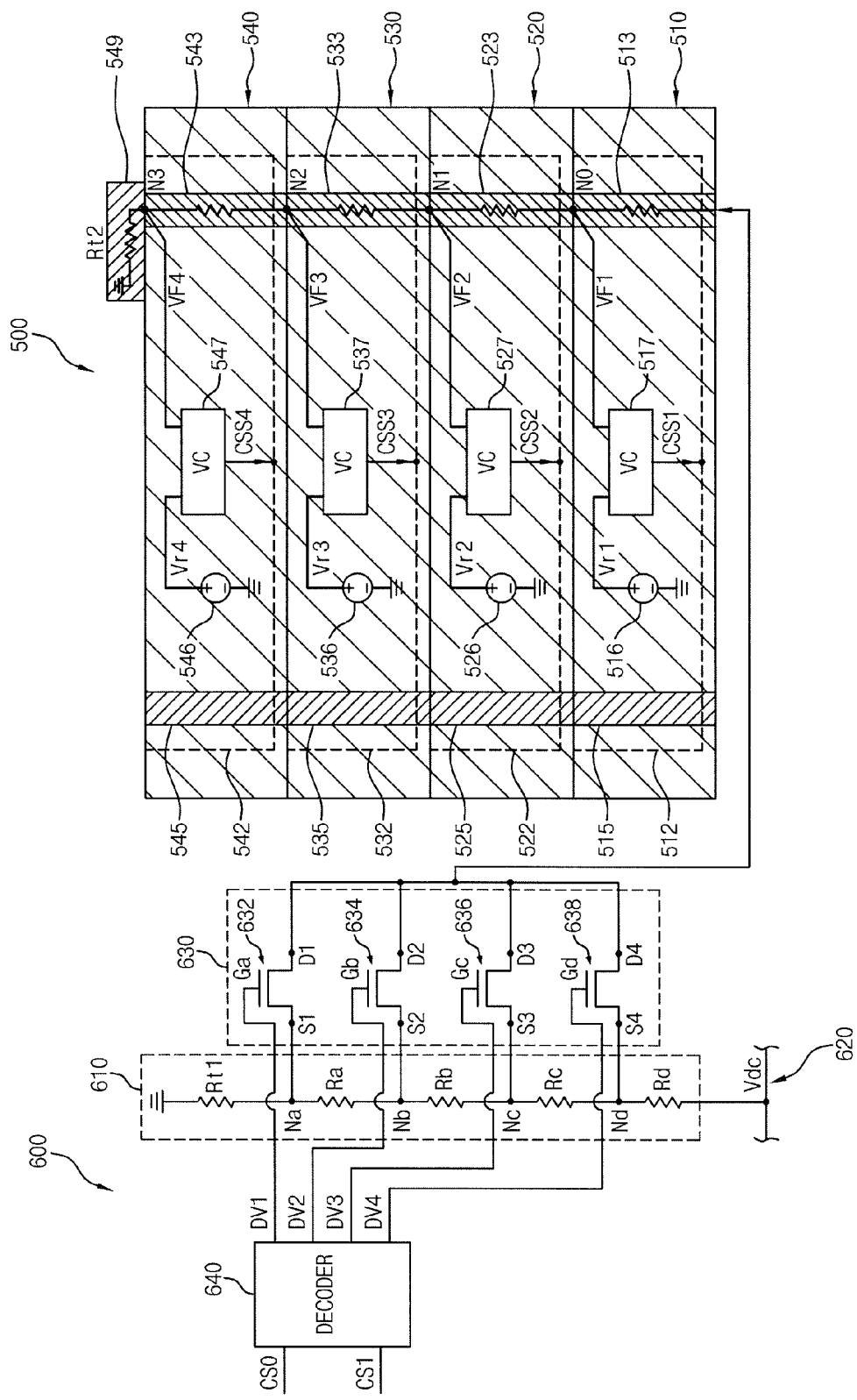
FIG. 6 is a block diagram showing a signal supply unit for generating first signals and second signals having different for use in the stacked semiconductor package shown in FIG. 5.

FIG. 6 is a block diagram showing a signal supply unit for generating the first signals and second signals (which are shown in FIG. 5) having different voltage levels.

Referring to FIG. 6, the stacked semiconductor package 500 further includes a signal supply unit 600. The signal supply unit 600 outputs a signal to the chip selection electrode 513 thereby resulting in the second signals VF1, VF2, VF3, and VF4 which are supplied to the chip selection electrodes 513, 523, 533, and 543 respectively. In the present embodiment, the signal supply unit 600 can be placed on a substrate (such as a printed circuit board) on which the first through fourth semiconductor chips 510, 520, 530, and 540 are mounted.

The signal supply unit 600 includes a voltage divider 610, a power supply section 620, switching sections 630, and a driving signal generation section 640.

The voltage divider 610 includes resistors Ra, Rb, Rc, and Rd connected in series. In one embodiment of the present invention, the number of the resistors Ra, Rb, Rc, and Rd corresponds to the number of stacked semiconductor chips. For example, since the number of the semiconductor chips in FIG. 5 is 4, the number of the resistors Ra, Rb, Rc, and Rd of the voltage divider 610 is set to 4. An additional grounded resistor Rt1 is connected to the resistor Ra.

The voltage divider 610 having the four resistors Ra, Rb, Rc and Rd (connected in series), has four nodes Na, Nb, Nc, and Nd which are formed between the respective resistors Ra, Rb, Rc, Rd, and Rt1.

The node Na is formed between the additional resistor Rt1 and the resistor Ra, the node Nb is formed between the resistors Ra and Rb, the node Nc is formed between the resistors Rb and Rc, and the node Nd is formed between the resistors Rc and Rd.

The power supply section 620 is electrically connected to the resistor Rd of the voltage divider 610 and supplies a DC voltage Vdc to the resistor Rd.

The driving signal generation section 640 generates a number of driving signals corresponding to the number of the semiconductor chips. In the embodiment of the present invention shown in FIG. 5, the driving signal generation section 640 generates four driving signals Dv1, Dv2, Dv3 and Dv4.

The number of switching sections 630 corresponds to the number of the semiconductor chips. For example, the plurality of switching sections 630 includes four switching sections in the embodiment of the present invention shown in FIG. 6. Herebelow, the switching sections 630 are referred to as a first switching section 632, a second switching section 634, a third switching section 636, and a fourth switching section 638.

In the first switching section 632, the source electrode S1 of a transistor is electrically connected to the node Na, the drain electrode D1 is electrically connected in series to the first chip selection electrode 513 of the first semiconductor chip 510, and the gate electrode Ga is connected to the driving signal generation section 640. The driving signal Dv1 from the driving signal generation section 640 is applied to the gate electrode Ga.

In the second switching section 634, the source electrode S2 of a transistor is electrically connected to the node Nb, the drain electrode D2 is electrically connected in series to the first chip selection electrode 513 of the first semiconductor chip 510, and the gate electrode Gb is electrically connected to the driving signal generation section 640. The driving signal Dv2 from the driving signal generation section 640 is applied to the gate electrode Gb.

In the third switching section 636, the source electrode S3 of a transistor is electrically connected to the node Nc, the drain electrode D3 is electrically connected in series to the first chip selection electrode 513 of the first semiconductor chip 510, and the gate electrode Gc is electrically connected to the driving signal generation section 640. The driving signal Dv3 from the driving signal generation section 640 is applied to the gate electrode Gc.

In the fourth switching section 638, the source electrode S4 of a transistor is electrically connected to the node Nd, the drain electrode D4 is electrically connected in series to the first chip selection electrode 513 of the first semiconductor chip 510, and the gate electrode Gd is electrically connected to the driving signal generation section 640. The driving signal Dv4 from the driving signal generation section 640 is applied to the gate electrode Gd.

Hereinbelow, a method for selecting the respective semiconductor chips included in the stacked semiconductor package shown in FIG. 6 according to an embodiment of the present invention will be described.

First, assuming that the resistance of the resistor Ra of the voltage divider 610 is, for example, 1Ω, the resistance of the resistor Rb is, for example, 2Ω, the resistance of the resistor Rc is, for example, 6Ω, the resistance of the resistor Rd is, for example, 0Ω, the resistance of the additional resistor Rt1 is, for example, 4Ω: when a DC voltage of 12[V] is supplied to the resistor Rd from the power supply section 620, the first signals Vr1~Vr4 outputted from the respective reference voltage supply parts 516, 526, 536, and 546 should be 2.4[V]. Thus, the first signals Vr1~Vr4 of 2.4[V] are inputted to the respective signal comparison parts 517, 527, 537, and 547 of the first through fourth semiconductor chips 510, 520, 530, and 540.

Meanwhile, as the DC voltage of 12[V] is applied to the voltage divider 610 from the power supply section 620, 12[V] is applied to the node Nd, 6[V] is applied to the node Nc, 4[V] is applied to the node Nb, and 3[V] is applied to the node Na.

The driving signal Dv1 is outputted from the driving signal generation section 640 in order to select the first semiconductor chip 510. The first switching section 632 is turned on in response to the driving signal Dv1, and the voltage of 3[V] is outputted from the node Na and inputted to the chip selection electrode 513 of the first semiconductor chip 510.

As 3[V] is applied to the chip selection electrode 513, 2.4[V] (3[V]×4/5) is applied to the signal comparison part 517 from the node N0. As 3[V] is applied to the chip selection electrode 513, 1.8[V] (3[V]×3/5) is applied to the signal comparison part 527 from the node N1. As 3[V] is applied to the chip selection electrode 513, 1.2[V] (3[V]×2/5) is applied to the signal comparison part 537 from the node N2. As 3[V] is applied to the chip selection electrode 513, 0.6[V] (3[V]×1/5) is applied to the signal comparison part 547 from the node N3.

Accordingly, because 2.4[V] is inputted from the reference voltage supply part 516 to the signal comparison part 517 of the first semiconductor chip 510, and 2.4[V] is applied from the node N0 to the signal comparison part 517 of the first semiconductor chip 510; the signal comparison part 517 outputs the chip selection signal CSS1 to the circuit section 512.

As a further example, if the driving signal Dv4 is outputted from the driving signal generation section 640 in order to select the fourth semiconductor chip 540, the fourth switching section 638 is turned on, and the voltage of 12[V] outputted from the node Nd is inputted to the chip selection electrode 513 of the first semiconductor chip 510.

As 12[V] is applied to the chip selection electrode 513, 9.6[V] (12[V]×4/5) is applied to the signal comparison part 517 from the node N0. As 12[V] is applied to the chip selection electrode 513, 7.2[V] (12[V]×3/5) is applied to the signal comparison part 527 from the node N1. As 12[V] is applied to the chip selection electrode 513, 4.8[V] (12[V]×2/5) is applied to the signal comparison part 537 from the node N2. As 12[V] is applied to the chip selection electrode 513, 2.4[V] (12[V]×1/5) is applied to the signal comparison part 547 from the node N3.

Accordingly, because 2.4[V] is received from the reference voltage supply part 546 to the signal comparison part 547 of the fourth semiconductor chip 540, and 2.4[V] is applied from the node N3 to the signal comparison part 547 of the fourth semiconductor chip 540; the signal comparison part 547 outputs the chip selection signal CSS4 to the circuit section 542. The remaining semiconductor chips of the stacked semiconductor package 500 can be selected similarly.

As is apparent from the above description, in the present invention, advantages are provided in that uniform semiconductor chips stacked upon one another can be selected using the voltage drop effect in their respective selection electrodes, which are connected in series.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor package comprising:
a semiconductor chip having a circuit section;
a first chip selection electrode passing through the semiconductor chip at a first position of the semiconductor chip, the first chip selection electrode having a first resistance and outputting a first signal;
a second chip selection electrode passing through the semiconductor chip at a second position of the semiconductor chip, the second chip selection electrode having a second resistance greater than the first resistance and outputting a second signal; and
a signal comparison part formed in the semiconductor chip and electrically connected to each of the first and second chip selection electrodes, wherein the signal comparison part compares the first signal to the second signal and outputs a chip selection signal to the circuit section depending upon the comparison.

2. The semiconductor package according to claim 1, further comprising:
a grounded re-distribution line formed on the semiconductor chip and electrically connected to the second chip selection electrode.

3. The semiconductor package according to claim 1, further comprising:
a data electrode passing through the semiconductor chip at a third position of the semiconductor chip, the data electrode having a third resistance less than the second resistance.

4. The semiconductor package according to claim 3, wherein the first resistance and the third resistance are substantially equivalent.

5. The semiconductor package according to claim 1, wherein the chip selection signal is outputted from the signal comparison part to the circuit section when the first and second signals are substantially equivalent.

6. A stacked semiconductor package comprising:
a plurality of semiconductor chips stacked upon one another, each semiconductor chip having a circuit section;
a first chip selection electrode passing through each of the semiconductor chips at a first position of the respective semiconductor chip, wherein each of the first chip selection electrodes has a first resistance and outputs a first signal;
a second chip selection electrode passing through each of the semiconductor chips at a second position of the respective semiconductor chip, wherein each of the second chip selection electrodes has a second resistance and outputting a second signal, and wherein the second resistance is greater than the first resistance; and
a signal comparison part formed in each of the semiconductor chips, wherein each of the signal comparison parts is electrically connected to the first and second chip selection electrodes of the respective semiconductor chip,
wherein each signal comparison part outputs a chip selection signal to the circuit section of the respective semiconductor chip depending upon the difference in the voltage level of the first and second signal received from the first and second chip selection electrodes of the respective semiconductor chip.

7. The stacked semiconductor package according to claim 6, further comprising:
a substrate on which the plurality of semiconductor chips are mounted, the substrate having a signal supply unit for generating the second signals such that each of the second signals has a different voltage level and generating the first signals such that each of the first signals has the same or substantially the same voltage level and the voltage level of the first signal is the same or substantially the same level as any one of the second signals.

8. The stacked semiconductor package according to claim 7, wherein the signal supply unit comprises:
a voltage divider for dividing a voltage having a preset level into a plurality of voltages having different levels;
a power supplying section for supplying the voltage having the preset level to the voltage divider;
a plurality of switching sections for outputting the plurality of voltages divided by the voltage divider; and
a driving signal generation section for driving the plurality of switching sections.

9. The stacked semiconductor package according to claim 8, wherein the voltage divider comprises resistors connected in series and having nodes, wherein the number of nodes corresponds to the number of the semiconductor chips.

10. The stacked semiconductor package according to claim 9, wherein each of the resistors has the same resistance value.

11. The stacked semiconductor package according to claim 9, wherein the voltage divider further comprises an additional grounded resistor connected in series to the resistors, and wherein the second chip selection electrodes are electrically connected to a grounded re-distribution line.

12. The stacked semiconductor package according to claim 9, wherein the switching sections are connected in parallel between the nodes and the first chip selection electrodes.

13. The stacked semiconductor package according to claim 8, wherein the power supply section supplies power to the voltage divider and the second chip selection electrodes.

14. The stacked semiconductor package according to claim 6, wherein each of the second chip selection electrodes has the same resistance value.

15. A semiconductor package comprising:
a semiconductor chip having a circuit section;
a chip selection electrode passing through the semiconductor chip and outputting a first signal;
a reference voltage supply part formed in the semiconductor chip and supplying and outputting a second signal; and
a signal comparison part formed in the semiconductor chip and electrically connected to each of the chip selection electrode and the reference voltage supply part, wherein the signal comparison part compares the first signal to the second signal and outputs a chip selection signal to the circuit section depending upon the comparison.

16. The semiconductor package according to claim 15, further comprising:
a grounded re-distribution line having a resistance formed on the semiconductor chip and electrically connected to the chip selection electrode.

17. The semiconductor package according to claim 15, further comprising:
a data electrode passing through the semiconductor chip,
wherein the data electrodes have a first resistance and the chip selection electrode has a second resistance greater than the first resistance.

18. The semiconductor package according to claim 15, wherein the chip selection signal is outputted from the signal comparison part to the circuit section when the first and second signals are substantially equivalent.

19. A stacked semiconductor package comprising:
a plurality of semiconductor chips stacked upon one another, each semiconductor chip having a circuit section;
a chip selection electrode passing through each of the semiconductor chips and outputting a first signal;
a reference voltage supply part formed in each of the semiconductor chips and supplying and outputting a second signal; and
a signal comparison part electrically connected to the chip selection electrode and the reference voltage supply part of each of the semiconductor chips,
wherein each of the signal comparison parts outputs a chip selection signal to the circuit section of the respective semiconductor chip depending upon the difference between the voltage level of the first and second signals received from the chip selection electrode and the reference voltage supply part of the respective semiconductor chip.

20. The stacked semiconductor package according to claim 19, further comprising:
a substrate on which the plurality of semiconductor chips are mounted, the substrate having a signal supply unit for generating the first signals, wherein each of the second signals has the same or substantially the same voltage level and each of the first signals has a different voltage level, and the voltage level of any one of the first signals is equivalent or substantially equivalent to the voltage level of the second signals.

21. The stacked semiconductor package according to claim 20, wherein the signal supply unit comprises:
a voltage divider for dividing a voltage having a preset level into a plurality of voltages having different levels;
a power supplying section for supplying the voltage having the preset level to the voltage divider;
a plurality of switching sections for outputting the plurality of voltages divided by the voltage divider; and a driving signal generation section for generating a plurality of driving signals for driving the respective switching sections.

22. The stacked semiconductor package according to claim 20, wherein the voltage divider comprises resistors connected in is series and having nodes, wherein the number of nodes corresponds to the number of the semiconductor chips.

23. The stacked semiconductor package according to claim 20, wherein each of the resistors has the same resistance value.

24. The stacked semiconductor package according to claim 20, wherein the voltage divider further comprises an additional grounded resistor connected in series to the resistors, and wherein the chip selection electrodes are electrically connected to a grounded re-distribution line.

25. The stacked semiconductor package according to claim 20, wherein the switching sections are connected in parallel between the nodes and the chip selection electrodes.

* * * * *